(12) United States Patent
Gattuso (10) Patent No.: US 7,938,649 B2
(45) Date of Patent: May 10, 2011

(54) ELECTRICAL CONNECTOR HAVING IMPROVED CONTACTS

(75) Inventor: Andrew Gattuso, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 16 days.

(21) Appl. No.: 12/460,134

(22) Filed: Jul. 13, 2009

(65) Prior Publication Data

US 2011/0009007 A1    Jan. 13, 2011

(51) Int. Cl.
*H01R 12/00*    (2006.01)
(52) U.S. Cl. ................. 439/71; 439/857; 439/948
(58) Field of Classification Search .......... 439/66, 439/71, 70, 857, 948
See application file for complete search history.

(56) References Cited

U.S. PATENT DOCUMENTS

| | | | | |
|---|---|---|---|---|
| 3,609,640 A | * | 9/1971 | Longenecker et al. | 439/345 |
| 3,718,895 A | * | 2/1973 | Reynolds et al. | 439/853 |
| 3,992,076 A | * | 11/1976 | Gluntz | 439/853 |
| 4,342,495 A | * | 8/1982 | Bennett et al. | 439/689 |
| 4,679,318 A | * | 7/1987 | Bright | 29/840 |
| 4,707,052 A | * | 11/1987 | Bouley | 439/844 |
| 4,784,622 A | * | 11/1988 | Senor | 439/853 |
| 4,934,967 A | * | 6/1990 | Marks et al. | 439/856 |
| 5,215,472 A | * | 6/1993 | DelPrete et al. | 439/71 |
| 5,362,244 A | * | 11/1994 | Hanson et al. | 439/82 |
| 5,877,554 A | * | 3/1999 | Murphy | 257/727 |
| 6,241,560 B1 | * | 6/2001 | Furusawa et al. | 439/700 |
| 7,201,584 B1 | * | 4/2007 | Ju et al. | 439/71 |

* cited by examiner

*Primary Examiner* — Neil Abrams
(74) *Attorney, Agent, or Firm* — Andrew C. Cheng; Wei Te Chung; Ming Chieh Chang (57) ABSTRACT

An electrical connector comprises an upper housing, a lower housing and a plurality of contacts which each have a top contact received in the upper housing and a bottom contact received in the lower housing. The top contact is formed with a keeping portion and a lower mating end downwardly; the bottom contact has a pair of mating beams extending vertically for engaging with the lower mating end of the top contact. The pair of mating beams of the bottom contact mechanically and electrically engage with the lower mating end of the top contact when the top contact approaches the bottom contact two mating beams in a top-to-bottom direction under a pressed force. The contact has a simple structure adapted to a high-density connector while still maintaining performance of the connector.

5 Claims, 8 Drawing Sheets

ELECTRICAL CONNECTOR HAVING IMPROVED CONTACTS

BACKGROUND OF THE INVENTION

1. Field of the Invention

The present invention relates to an electrical connector for electrically connecting an electronic package such as a microprocessor with a circuit substrate such as a printed circuit board (PCB), and more particularly to an electrical connector having improved contacts adapted to a high-density connector.

2. Description of Prior Art

Land Grid Array (LGA) connector is widely used for establishing electrical connection between an electronic package, e.g. a Central Processing Unit (CPU), and a PCB, e.g. a motherboard. Such LGA connector is typically illustrated in U.S. Pat. No. 7,044,746 issued to Copper on May 16, 2006. With the development of society, people have a higher need for capability of the CPU. Accordingly, LGA connector for connecting the CPU and the motherboard is requested to have a better performance. Additionally, to suit the industry trend of miniaturization of electric device, the connector is also requested to comply with a trend of miniaturization and multiple contact points.

One solution is to reduce the size of the contacts. However, due to the small size of the contacts, resilient arm of the contact is easily damaged because of larger stress therein when the contact is engaged with the pad of the CPU. Accordingly, electrical connection is unsteady.

In view of the above, an improved electrical connector that overcomes the above-mentioned disadvantages is desired.

SUMMARY OF THE INVENTION

Accordingly, an object of the present invention is to provide an electrical connector for electrically connecting an electronic package such as a CPU with a circuit substrate such as a PCB, wherein the contacts maintain performance of the electrical connector while still maintaining a high density array in the electrical connector.

To achieve the above-mentioned object, an electrical connector in accordance with a preferred embodiment of the present invention for electrically connecting an electronic package with a PCB is provided. An electrical connector comprises an upper housing, a lower housing and a plurality of contact units which each have a top contact received in the upper housing and a bottom contact received in the lower housing. The top contact is formed with a keeping portion and a lower mating end downwardly; the bottom contact has a pair of mating beams extending vertically for engaging with the lower mating end of the top contact. The pair of mating beams of the bottom contact mechanically and electrically engage with the lower mating end of the top contact when the top contact approaches the bottom contact two mating beams in a top-to-bottom direction under a pressed force. The contact unit has a simple structure adapted to a high-density connector while still maintaining performance of the connector.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Referring to FIGS. 1-8, an electrical connector 1 in accordance with the preferred embodiment of the present invention is used for electrically connecting an electrical package (not shown) with a PCB (not shown). The connector 1 comprises an upper housing 10, a lower housing 12 and a plurality of contact units 14.

Each of contact units 14 comprises a top contact 140 and a bottom contact 142. The lower housing 12 defines a plurality of through gaps 120 for receiving the bottom contacts 142; the upper housing 10 is mounted upon the lower housing 12 and defines a plurality of receiving slots 100 for receiving the top contacts 140. The upper housing 10 further defines an upper surface 102 and peripheral walls 104 extending upwardly from the upper surface 102. The upper surface 102 is adapted to have an electrical package seated thereon and defines a receiving cavity for containing the electrical package therein jointly with the peripheral walls 104.

The top contact 140 comprises a keeping portion 1400 for positioning the top contact 140 in the upper housing 10, an upper contacting end 1402 extending from a top end of the keeping portion 1400, and a lower mating end 1404 extending downwardly from a lower end of the keeping portion 1400. In assembly, the upper contacting end 1402 extends above the upper surface 102 of the upper housing 10.

Figure 1:
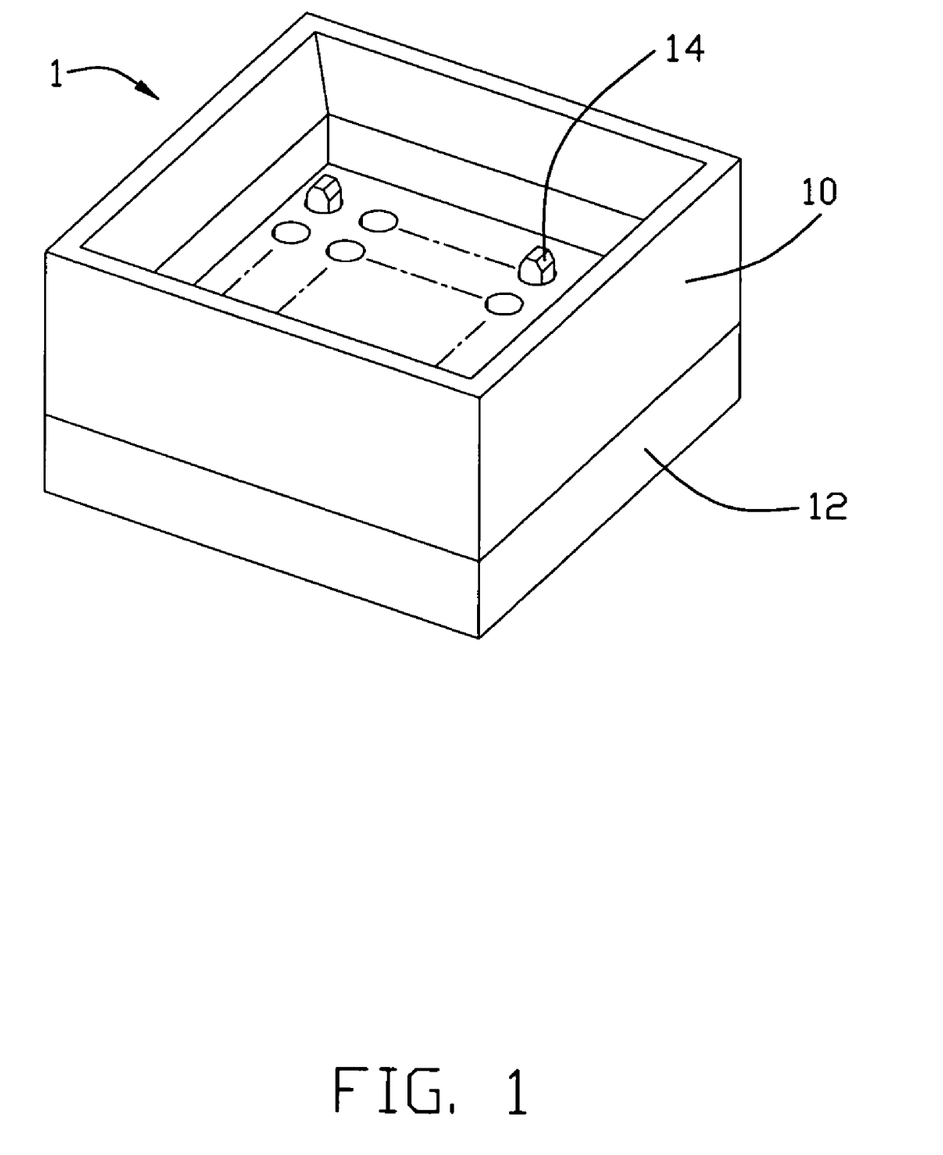
FIG. 1 is an assembly view of an electrical connector in accordance with the present invention.
Figure 2:
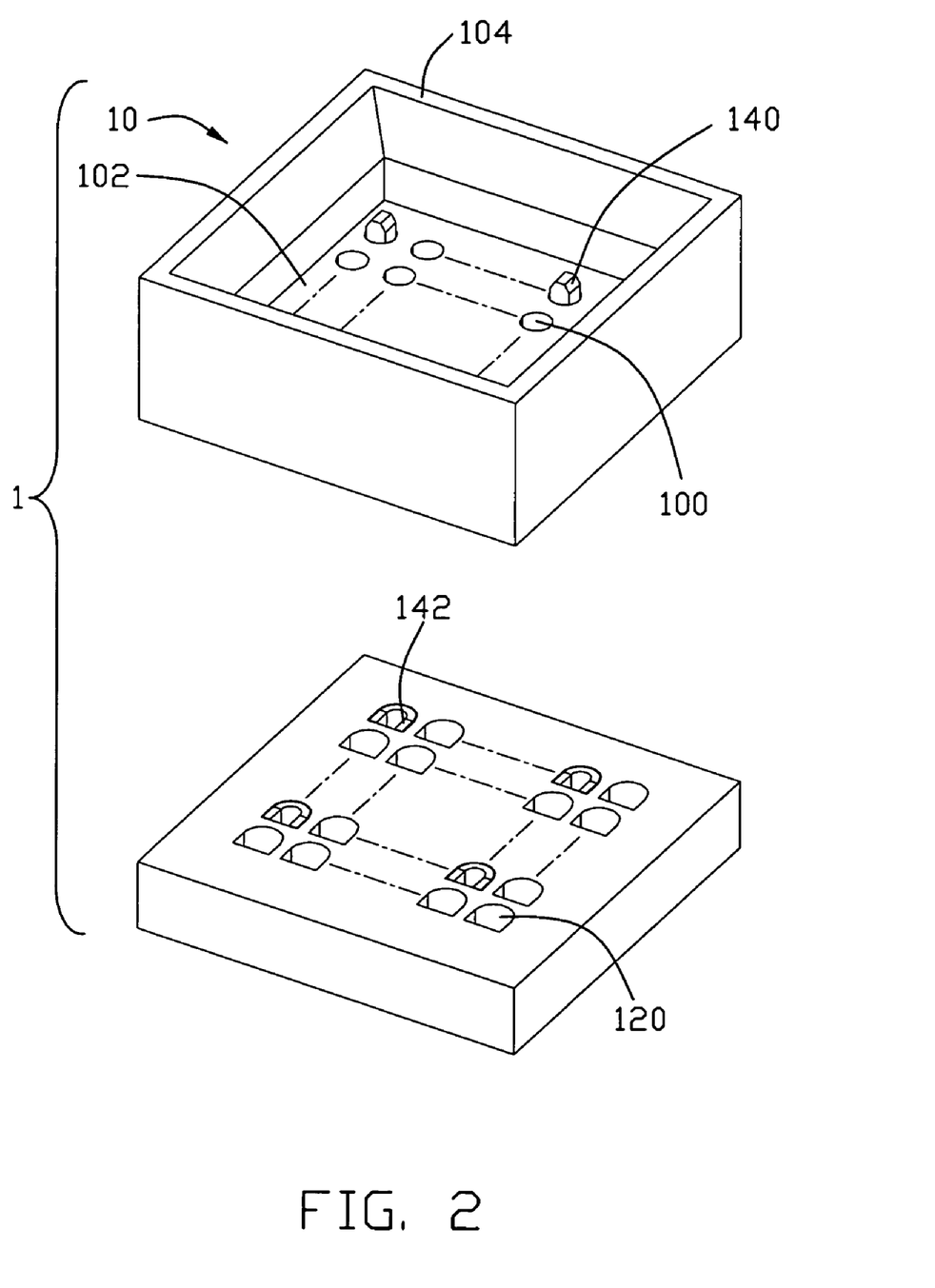
FIG. 2 is an exploded view of the electrical connector in accordance with the present invention.
Figure 3:
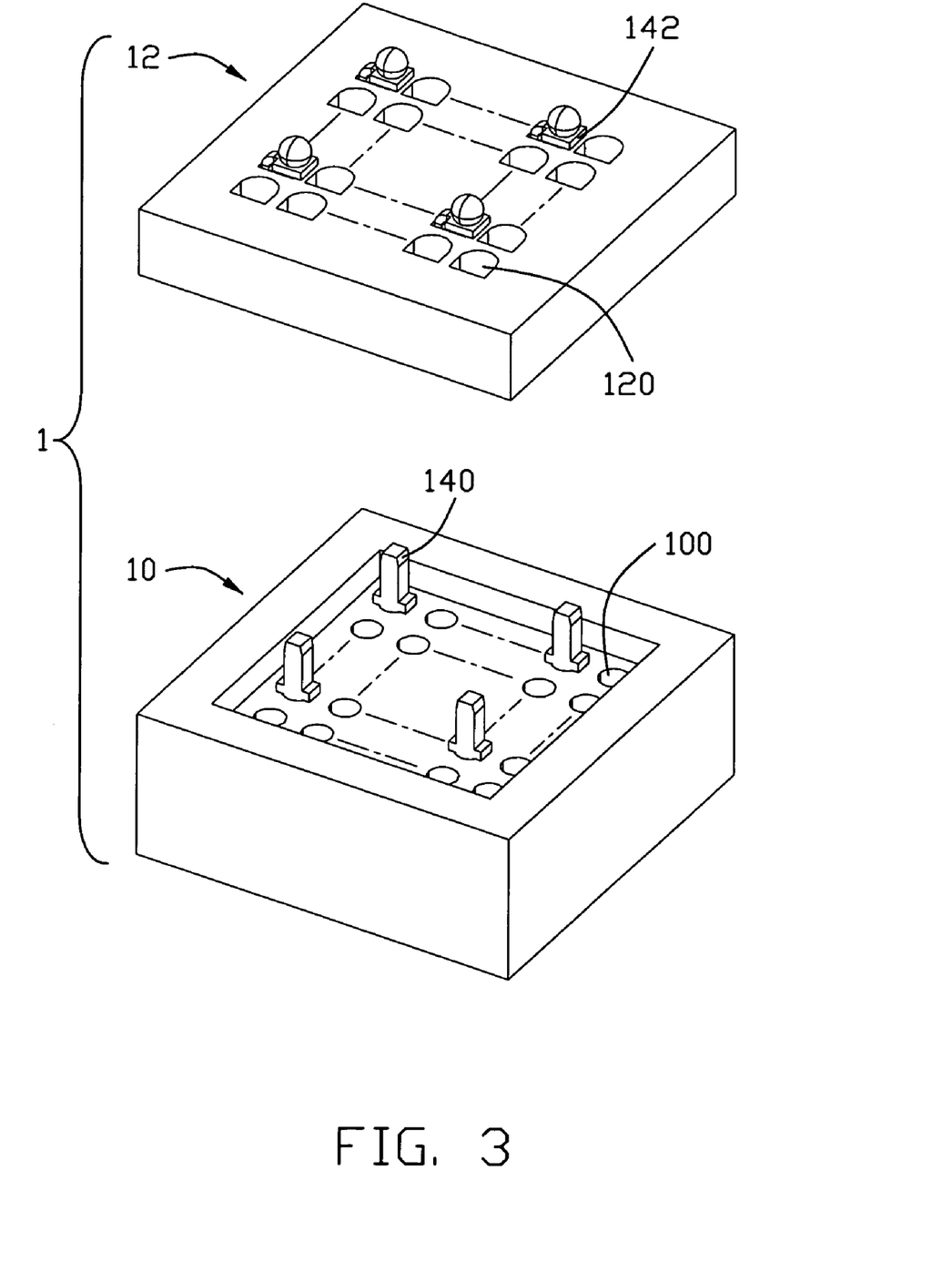
FIG. 3 is also an exploded view of the electrical connector in accordance with the present invention, but from another angel.
Figure 4:
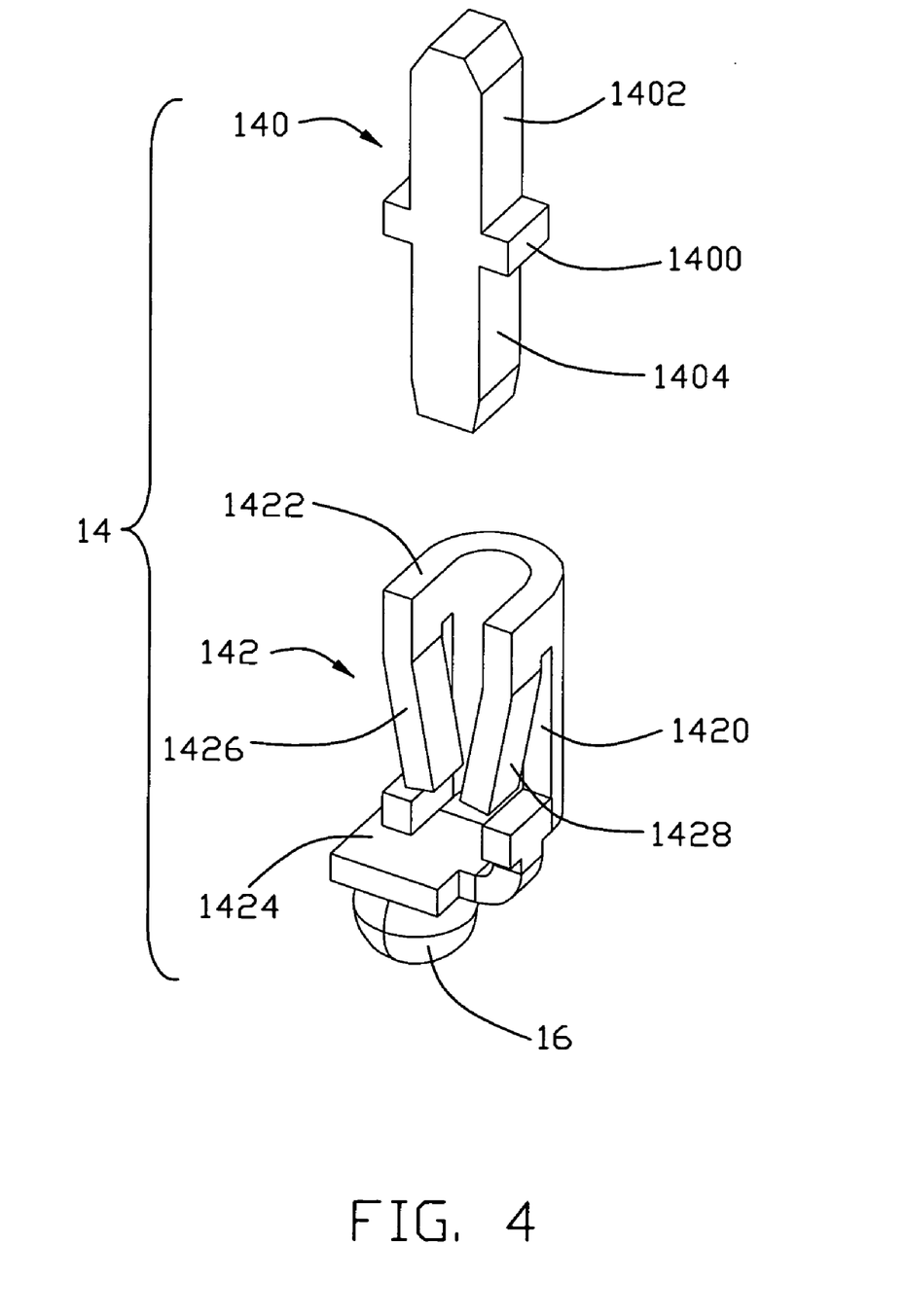
FIG. 4 is an exploded view of the contact unit in accordance with the present invention.
Figure 5:
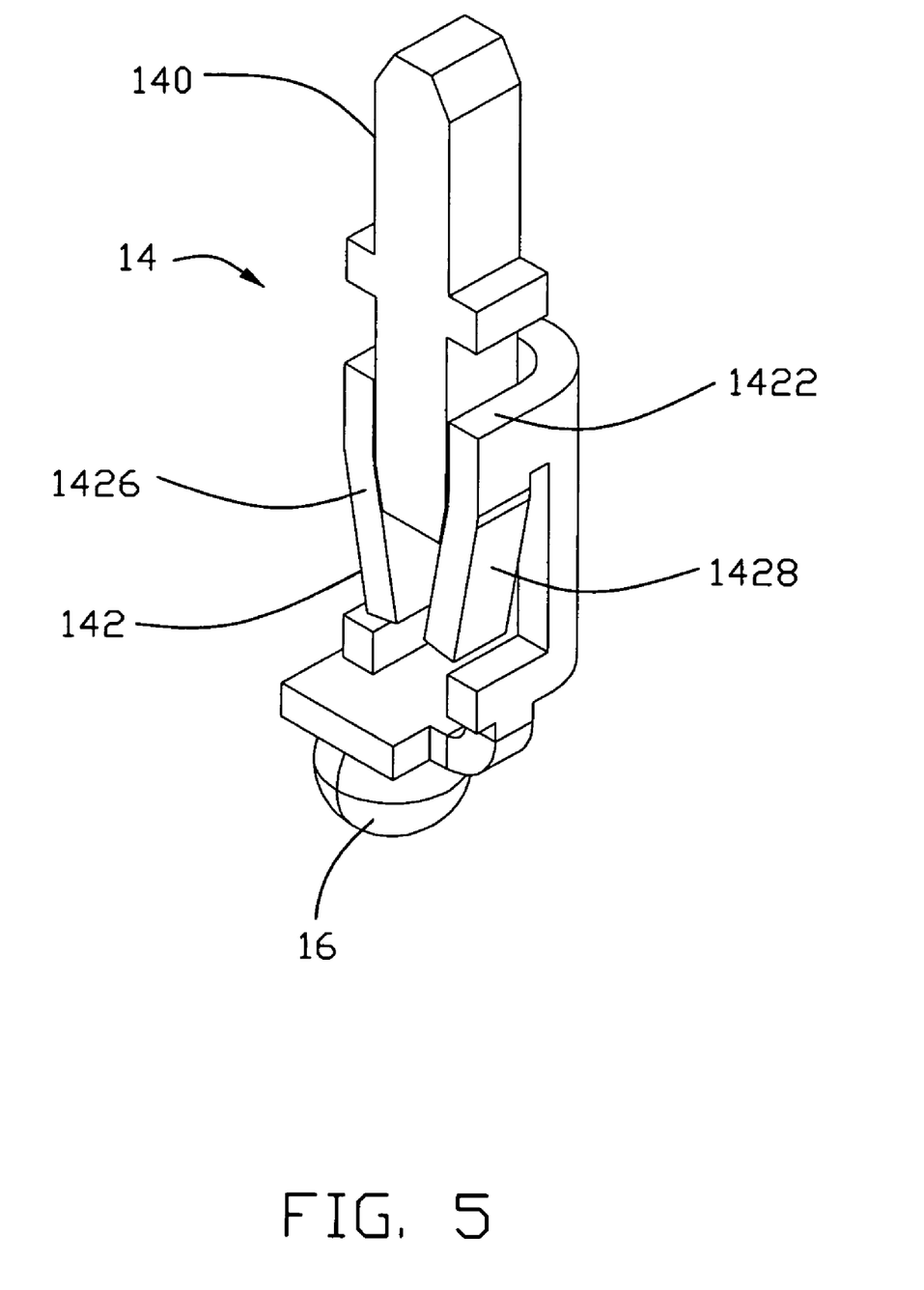
FIG. 5 is an assembly view of the contact unit in accordance with the present invention.

The bottom contact 142 comprises a main portion 1420 extending in a vertical direction, a "U" shaped bight portion 1422 arranged on a top end of the main portion 1420, and a lower mounting end 1424 extending from a lower portion of the main portion 1420. Referring to FIGS. 4-5, the bight portion 1422 has two free ends spaced to each other. A pair of mating beams 1426, 1428 extends downwardly from a lower end of the two free ends, respectively. In the vertical direction and in a top-to-bottom direction (direction of the arrow F in FIG. 7-8), the two mating beams 1426, 1428 extend gradually approaching to each other in their free ends. In other words, a channel 1429 is defined by the pair of mating beams 1426, 1428, and provides a space to allow movement of the lower mating end 1404 of the top contact 140 under a condition that dimension of the channel 1429 is gradually reduced in the top-to-bottom direction. The pair of mating beams 1426, 1428 is provided to be symmetrical with respective to each other.

The lower mounting end 1424 and the two mating beams 1426, 1428 are located in a same side relative to the main portion 1420. Also, the lower mounting end 1424 is formed with a flat solder pad extending in horizontal direction and adapted to a solder ball 16. Accordingly, space of the through gaps 120 in horizontal direction may be low. Moreover, the contact unit 14 does not need a long resilient arm, thus has a lower need of distance between two adjacent contact units 14.

The lower mounting end 1424 is located in a position below the two beams 1424, 1426. In detail, the lower mounting end 1424 extends from a lower portion of the main portion 1420, which is located below and corresponding to one free end of the bight portion 1422. Then, the lower mounting end 1424 extends toward the other free end of bight portion 1422.

Figure 6:
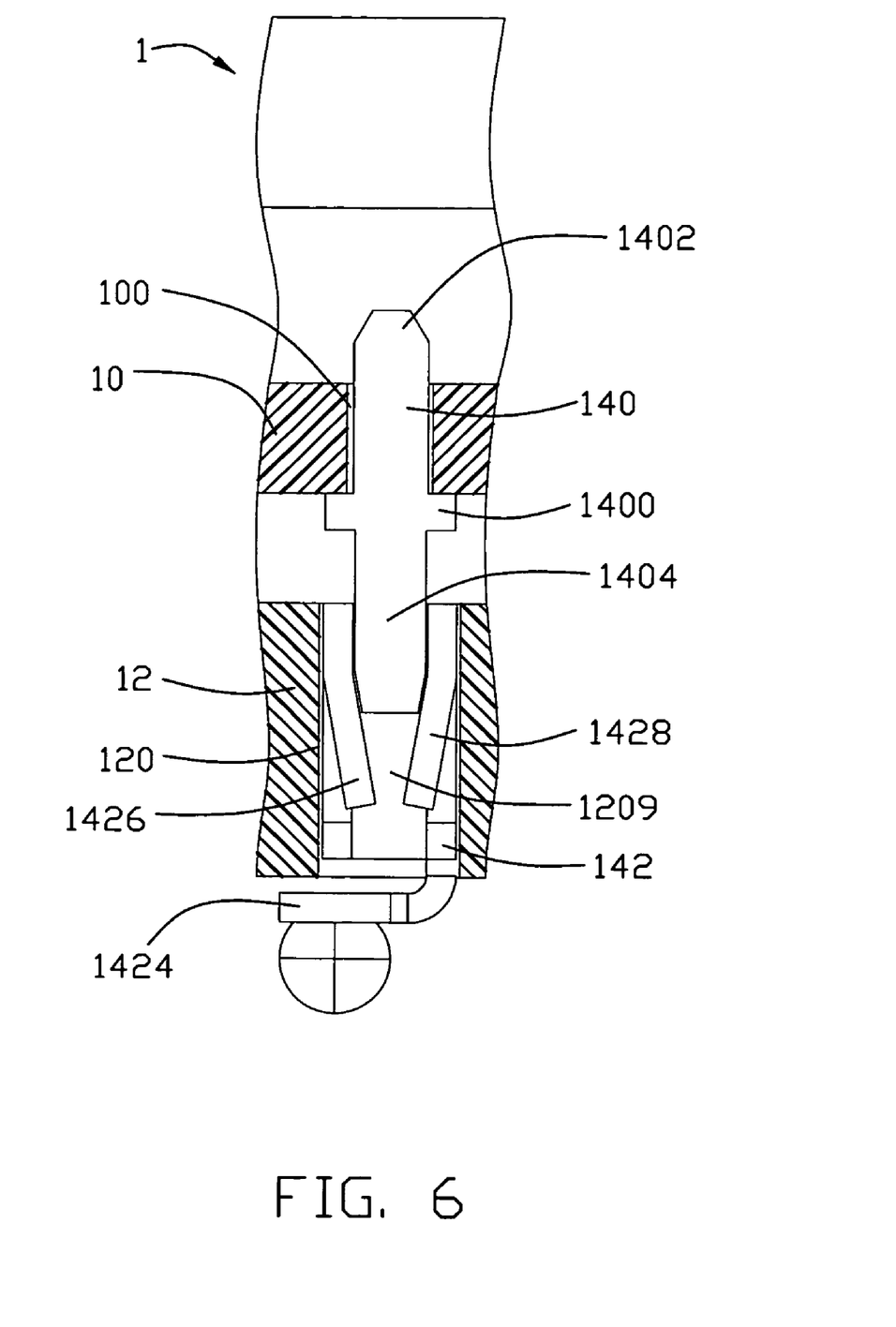
FIGS. 6-8 depict a process of a top contact engaged with a bottom contact of the invention.
Figure 7:
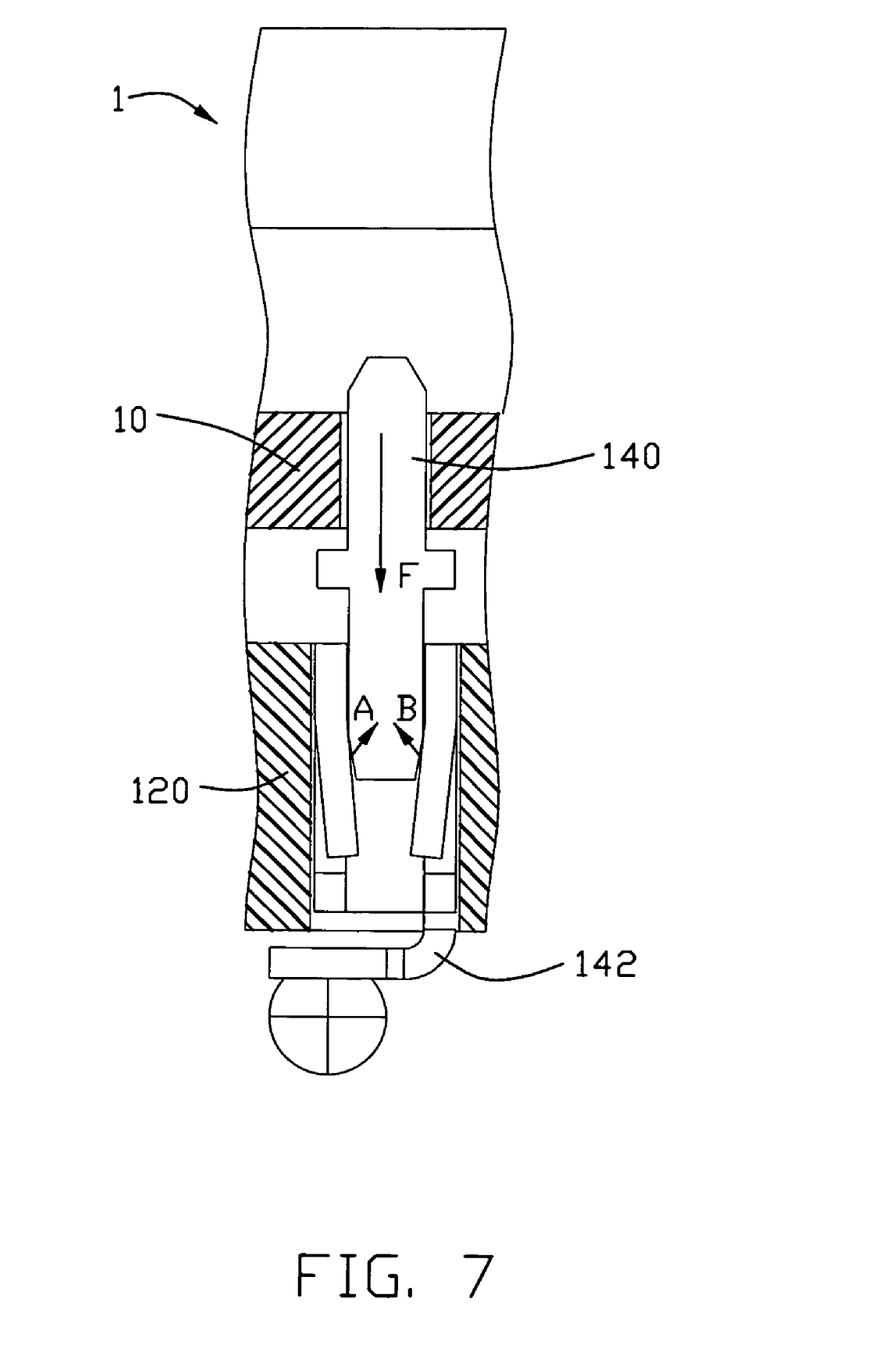
Figure 8:
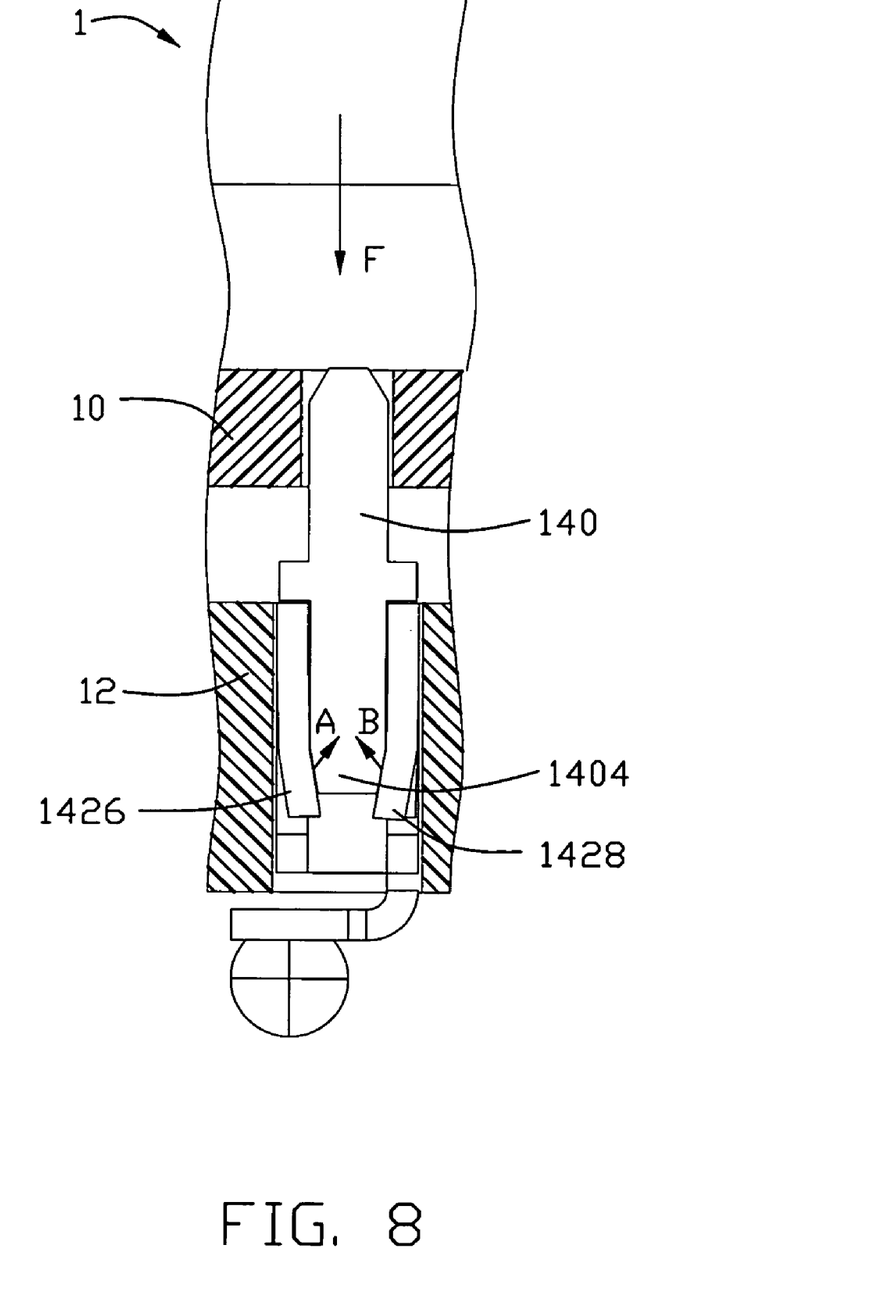

Referring to FIGS. 6-8, a process of the top contact 140 engaged with the bottom contact 140 is shown. When the top contact 140 approach the bottom contact 142 under an external force F in the top-to-bottom direction, due to space between the pair of mating beams 1426, 1428 is gradually reduced, the mating beams 1426, 1428 will exert elastic deformation under stress from the lower mating end 1404 and then will exert elastic force A, B, respectively. The elastic force will act on the lower mating end 1404 of the top contact 140. Accordingly, the pair of mating beams 1426, 1428 of the bottom contact 140 is mechanically and electrically engaged with the lower mating end 1404 of the top contact 140.

As depicted above, the contact unit 14 of the prevent invention has a simple structure and will occupy a lower space in the housing. Thus, the contact unit 14 will meet a trend of miniaturization of electrical connector and is adapted to a high-density connector while still maintaining performance of the connector.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector comprising:
    a plurality of contact units, each contact unit having a top contact and a bottom contact, the top contact formed with a keeping portion and a lower mating end downwardly; the bottom contact having a pair of mating beams extending vertically for engaging with the lower mating end of the top contact;
    a lower housing defining a plurality of through gaps for receiving the bottom contacts; and;
    an upper housing mounted upon the lower housing and defining a plurality of receiving slots for receiving the top contacts; wherein
    when the top contact approaches the bottom contact two mating beams in a top-to-bottom direction under a pressed force, elastic force is generated by the pair of mating beams due to elastic deformation and acts on the lower mating end, thus making the pair of mating beams of the bottom contact mechanically and electrically engage with the lower mating end of the top contact;
    wherein the pair of mating beams extends gradually approaching to each other in the top-to-bottom direction;
    wherein a channel is defined by the pair of mating beams, and provides a space to allow movement of the lower mating end of the top contact under a condition that dimension of the channel is gradually reduced in the top-to-bottom direction;
    wherein the bottom contact comprises a main portion extending vertically with a bight portion arranged on a top end of the main portion, wherein the pair of mating beams extends from the bight portion.

2. The electrical connector as claimed in claim 1, wherein the two mating beams are provided to be symmetrical with respective to each other.

3. The electrical connector as claimed in claim 2, wherein the two mating beams are arranged on opposite free ends of the bight portion and extend downwardly.

4. An electrical connector comprising:
    an insulative housing defining a plurality of passageways, each of said passageways defining an upper section and a lower section thereof;
    a plurality of contact sets respectively disposed in the corresponding passageways, each of said contact sets including an upper contact, which is essentially located in the corresponding upper section, engageably supported by a lower contact, which is essentially located in the corresponding lower section, an upper end of the upper contact extending above an upper face of the housing for engagement with an electronic package; wherein
    said upper contact is configured to be upper and down moveable, between upper and lower positions, relative to the corresponding lower contact in a restraint manner under condition that said lower contact is deformed to provide a restored force to urge the upper contact upward away from the lower contact when said upper contact is moved to said lower section; wherein
    the lower contact includes a main portion extending in a vertical direction, a bight portion arranged on an upper end of the main portion, and a pair of mating beams extending downwardly from the bight portion and deformed to provide said restored force.

5. The electrical connector as claimed in claim 4, wherein said upper contact includes a pair of laterally expanded keeping portions downwardly abutting against the bight portion when the upper contact is moved to the lower position.

* * * * *